United States Patent
Fujita et al.

(10) Patent No.: US 8,047,020 B2
(45) Date of Patent: Nov. 1, 2011

(54) METHOD OF PRODUCING VITREOUS SILICA CRUCIBLE

(75) Inventors: Takeshi Fujita, Akita (JP); Minoru Kanda, Akita (JP)

(73) Assignee: Japan Super Quartz Corporation, Akita-Shi (JP)

( * ) Notice: Subject to any disclaimer, the term of this patent is extended or adjusted under 35 U.S.C. 154(b) by 0 days.

(21) Appl. No.: 12/304,154

(22) PCT Filed: Jul. 25, 2008

(86) PCT No.: PCT/JP2008/063443
§ 371 (c)(1),
(2), (4) Date: Dec. 10, 2008

(87) PCT Pub. No.: WO2009/017071
PCT Pub. Date: Feb. 5, 2009

(65) Prior Publication Data
US 2010/0162760 A1    Jul. 1, 2010

(30) Foreign Application Priority Data
Jul. 27, 2007   (JP) .................................. 2007-196649

(51) Int. Cl.
*C03B 19/01* (2006.01)
*C03B 19/09* (2006.01)

(52) U.S. Cl. ........................................................ 65/17.3

(58) Field of Classification Search .................... 65/17.3
See application file for complete search history.

(56) References Cited

U.S. PATENT DOCUMENTS

| | | | |
|---|---|---|---|
| 4,416,680 A | 11/1983 | Bruning et al. | |
| 5,174,801 A * | 12/1992 | Matsumura et al. | 65/17.3 |
| 6,672,107 B2 * | 1/2004 | Werdecker et al. | 65/17.4 |
| 2002/0192409 A1 * | 12/2002 | Ohama et al. | 428/34.6 |
| 2003/0074920 A1 | 4/2003 | Ohama et al. | |
| 2006/0174651 A1 | 8/2006 | Ohama et al. | |
| 2009/0084308 A1 * | 4/2009 | Kishi et al. | 117/13 |
| 2010/0095880 A1 * | 4/2010 | Fukui et al. | 117/13 |

(Continued)

FOREIGN PATENT DOCUMENTS

JP          59-34659          8/1984

(Continued)

OTHER PUBLICATIONS

English Language Abstract of JP 2004-262690.
English Language Abstract of KR 10-2005-0101564.
English Language Abstract of JP 2001-348240.
English Language Abstract of JP 2000-72594.
English Language Abstract of NO 2005-4401.

(Continued)

*Primary Examiner* — Matthew Daniels
*Assistant Examiner* — Russell Kemmerle, III
(74) *Attorney, Agent, or Firm* — Greenblum & Bernstein, P.L.C.

(57) ABSTRACT

The method of producing a vitreous silica crucible, comprises deposition step of depositing silica powder on an inner wall surface of a cylindrical rotation mold having a bottom while rotating the mold; and a fusion step to obtain a vitreous silica crucible by heating and fusing the silica powder deposited on the inner wall surface of the mold and thereby vitrifying the silica powder. In the deposition step, a density of the deposited silica powder layer on the inner wall surface of the mold is controlled within a predetermined range by controlling the electrostatic charging voltage of the silica powder to be in a range of 1.0 kV or less in absolute value, and supplying the thus controlled silica powder to the inner wall surface of the mold. Thus, a wall thickness of the vitreous silica crucible is controlled.

3 Claims, 2 Drawing Sheets

U.S. PATENT DOCUMENTS

2010/0095881 A1* 4/2010 Fukui et al. .............. 117/13
2010/0229599 A1* 9/2010 Fujita et al. .............. 65/33.9

FOREIGN PATENT DOCUMENTS

| | | |
|---|---|---|
| JP | 2000-72594 | 3/2000 |
| JP | 2001-348240 | 12/2001 |
| JP | 2004-262690 | 9/2004 |
| WO | 01/92169 | 12/2001 |
| WO | 01/92170 | 12/2001 |
| WO | 2004/076725 | 9/2004 |

OTHER PUBLICATIONS

U.S. Appl. No. 12/168,375, filed Jul. 7, 2008, and entitled "Method for Producing Vitreous Silica Crucible".

U.S. Appl. No. 12/169,838, filed Jul. 9, 2008, and entitled "Method for Producing Quartz Glass Crucible".

U.S. Appl. No. 12/351,115, filed Jan. 9, 2009, and entitled "Method of Manufacturing Silica Glass Crucible for Pulling Silicon Single Crystals".

* cited by examiner

METHOD OF PRODUCING VITREOUS SILICA CRUCIBLE

TECHNICAL FIELD

The present invention relates to a method of producing vitreous silica crucible, excellent in controllability of a wall thickness of the crucible.

Priority is claimed on Japanese Patent Application, No. 2007-196649, filed on Jul. 27, 2007, the content of which is incorporated herein by reference.

BACKGROUND ART

In general, a silicon single crystal is manufactured under high temperature conditions by pulling the crystal from a silicon melt stored in a vitreous silica crucible. Rotation mold method (Patent Reference 1) is known as a method of producing the vitreous silica crucible. In this method, silica powder is deposited on an inner surface of rotating cylindrical mold that has inner space (cavity) and a bottom. The silica powder is fused (molten) at high temperature by arc discharge or the like, vitrified, and is formed to have a shape of a crucible in accordance with the shape of the inner surface of the mold. After cooling, by removing from the mold, a designated crucible is obtained.

A vitreous silica crucible used in a pulling of a silicon single crystal is required to have a high precision in its shape as well as a high purity in the same level as that of a semiconductor. For example, if the wall thickness of the crucible is not constant, even though a charge of polycrystalline silicon is maintained at constant amount, surface level of the silicon melt fluctuates when the polycrystalline silicon is molten. In addition, because of the fluctuation of the melt surface, falling rate of the melt surface compared with the pulling rate is not stable even though the pulling rate is maintained at constant during pulling a silicon single crystal from the silicon melt, thereby causing decrease in the yield of single crystal.
Patent Reference 1 Japanese Patent No. 1257513 (Japanese Patent Publication No. S59-34659).

DISCLOSURE OF INVENTION

Problems to be Solved by the Invention

In the method of manufacturing a vitreous silica crucible by the rotation mold method, silica powder is deposited in constant thickness on an inner wall surface of the rotation mold, and is heated and fused. Therefore, if the thickness of the silica powder deposition or the density of the silica powder deposition on the wall surface of the mold is inhomogeneous, a wall of the produced crucible does not have a constant thickness. As a result, it is impossible to obtain a crucible of high quality. Specifically, in the rotation mold method, since silica powder is deposited on the inner wall surface of the mold, there is a problem that the deposition state is easily influenced by a property of the silica powder.

Devices for Solving the Problem

The inventors found that electrostatic charge of the silica powder had a large influence on the deposition state of silica powder at the time of depositing the silica powder in a constant thickness on the inner surface of the rotation mold. In addition, it was found that the electrostatic charge of the silica powder could be controlled effectively by controlling relative humidity of the ambient atmosphere while supplying the silica powder to the rotation mold.

The present invention solved the above-described problem based on the above-described findings and provides a production method of a vitreous silica crucible capable of achieving a vitreous silica crucible having a constant wall thickness by controlling the electrostatic charging voltage of silica powder and/or relative humidity of supplying environment within a preferable range.

The present invention relates to a method of producing vitreous silica crucible, comprising the below-describe constitution to solve the conventional problems.

[1] A method of producing a vitreous silica crucible, comprising: depositing silica powder on an inner wall surface of a rotation mold; and vitrifying the silica powder by heating and fusing the powder, wherein electrostatic charging voltage of the silica powder is controlled to be in a range of 1.0 kV or less in absolute value, and the thus controlled silica powder is supplied to the inner wall surface of the mold to maintain the density of the deposited silica powder layer on the inner wall surface of the mold within a predetermined range, thereby controlling the wall thickness of the vitreous silica crucible.

[2] A method of producing a vitreous silica crucible, comprising:
supplying silica powder to an inner wall surface of a mold while controlling electrostatic charging voltage of the silica powder to be within a range of 0.0 kV to −1.0 kV by controlling a relative humidity of an ambient atmosphere of the supplied silica powder to be not lower than 55%; and depositing the silica powder.

[3] A method of producing a vitreous silica crucible, comprising controlling a thickness of silica powder layer deposited on a bottom portion on a mold to be within a target thickness ±1%.

Effect of the Invention

The production method according to the invention supplies silica powder to an inner surface of a mold while controlling an electrostatic charging voltage of the silica powder to be 1.0 kV or less in absolute value. Therefore, it is possible to control a density of the silica powder layer deposited on an inner wall surface of the mold to be within a predetermined range. As a result, it is possible to produce a constant vitreous silica crucible in which fluctuation in wall thickness during vitrifying the wall is reduced to very low level.

Specifically, it is possible to control an electrostatic charging voltage of the silica powder to be in the range of 0.0 kV to −1.0 kV by controlling a relative humidity of atmospheric gas (which may be air) to be not lower than 55% during supplying the silica powder. By this control of the electrostatic charging voltage, fluctuation in layer thickness of the silica powder layer deposited on an inner surface of the mold is suppressed, and an amount of scraping (shaving) off of a portion exceeding a target thickness is largely reduced. Although the shaved silica powder falls on an inner bottom portion of a rotation mold, it is possible to prevent the increase of wall thickness of bottom portion of the crucible since only a small amount is shaved.

EXPLANATION OF SYMBOL

Figure 1:
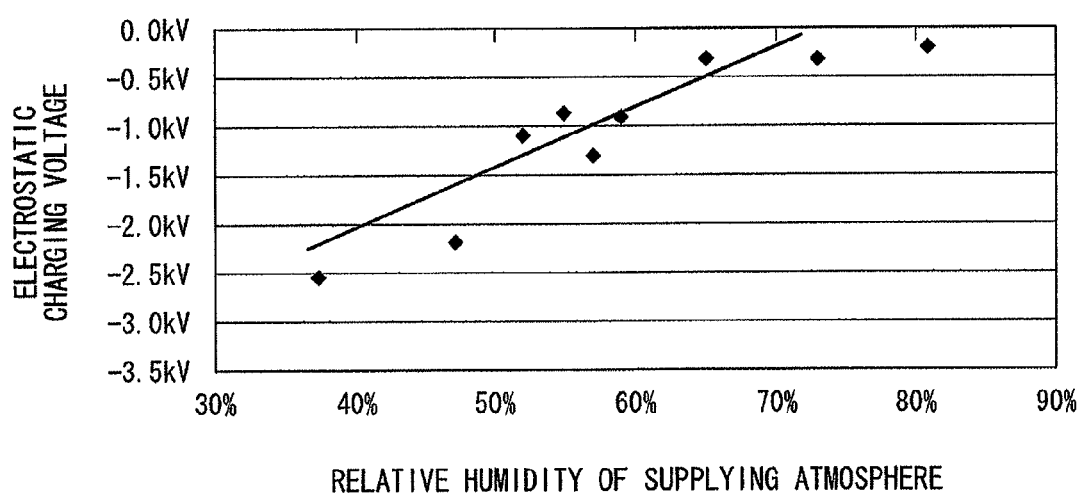
FIG. 1 is a graph showing a relation between a relative humidity of a silica powder supply atmosphere and a charging voltage of the silica powder.

1 Mold
6 Silica powder supplying device
10 Silica powder
12 Silica powder deposit layer
14 Humidity controlling device
18 Arc discharging device

BEST MODE FOR CARRYING OUT THE INVENTION

In the following, an embodiment of the present invention is explained specifically.

A method of producing a vitreous silica crucible according to the present embodiment comprises: depositing silica powder on an inner wall surface of a rotation mold; and vitrifying the silica powder by heating and fusing the powder, wherein electrostatic charging voltage of the silica powder is controlled to be in a range of 1.0 kV or less in absolute value, and the thus controlled silica powder is supplied to the inner wall surface of the mold to maintain the density of the deposited silica powder layer on the inner wall surface of the mold within a predetermined range, thereby controlling the wall thickness of the vitreous silica crucible. The electric charging voltage of the silica powder may be measured by known charging measuring device, for example, using Faraday cage method or the like.

In general, in a production of vitreous silica crucible using a rotation mold, silica powder deposited on an inner wall surface of a mold is deposited in constant thickness utilizing a centrifugal force of a rotating mold. Where the wall includes a portion exceeding (outside) a target thickness, silica powder of the thick portion is shaved off by a device (jig) to control the wall to have the target thickness. Since the thus shaved silica powder falls on a bottom portion of the mold, large amount of shaved silica powder causes increase in thickness of the bottom portion of the crucible. Therefore, when the silica powder is deposited on an inner wall surface of the mold, it is required to deposit the silica powder to have the target thickness constantly and reduce the amount of the silica powder to be shaved off.

Where a silica powder is deposited on an inner wall surface of a rotation mold in the above-described production method, density of the silica powder layer varies (differs) in accordance with changing of electrostatic charging voltage of the silica powder, and the variation in density causes inhomogeneous layer thickness of the silica powder layer. In the production method of the present embodiment, the above-described changing of electrostatic charging voltage is suppressed. For example, electrostatic charging voltage of a silica powder is controlled within a range of 1.0 kV or less in absolute value so as to form the silica powder layer in constant layer thickness. Specifically, since a silica powder is charged in negative, electrostatic charging voltage of the silica powder is controlled to be in a range of 0.0 kV to −1.0 kV. Although it is not a limiting, more preferable range is 0.0 kV to −0.9 kV.

Specifically, in the production method according to the embodiment, by supplying a silica powder to an inner wall surface of a mold while controlling an electrostatic charging voltage of the silica powder to be in a range of 0.0 kV to −1.0 kV, it is possible to control the thickness of a silica powder layer deposited on a bottom portion of the mold to be within ±1% compared with a target thickness. Here, ±1% with respect to a density and layer thickness of the silica powder deposit layer denotes a fact that fluctuation of density and layer thickness is within a range of ±1% in silica powder layer deposited on a whole inner surface of the mold. Specifically, it is acceptable when a density and a thickness of the silica powder deposit layer measured at an arbitrary portion on an inner surface of the mold are within target values ±1%.

When an electrostatic charging voltage of the silica powder exceeds −1.0 kV, variation in density of the silica powder deposited on an inner wall surface of the mold is increased, and the silica powder layer is given an inhomogeneous thickness. Therefore, amount of silica powder to be shaved to obtain a target thickness is increased and the silica powder falls on a bottom portion, thereby causing increasing of thickness of a bottom portion of a crucible. For example, according to the Examples, thickness of the silica powder deposit layer of a bottom portion of the crucible is 103.9% of the target thickness where an electrostatic charging voltage of the silica powder is −1.4 kV. A thickness of the silica powder deposit layer of a bottom portion of the crucible is about 105.6% of the target thickness where an electrostatic charging voltage of the silica powder is −2.9 kV. In any of these cases, it is impossible to control the layer thickness of the silica powder layer in a bottom portion of the crucible to be within ±1% of the target thickness.

Where the electrostatic charging voltage of the silica powder is increased, density of the deposited silica powder layer is changed. As a result, even when the silica powder layer for the side wall of the crucible is controlled in accordance with the target thickness, after a formation of the crucible by heating, fusing and vitrifying the deposit, wall thickness of the side wall portion of the crucible tends to have a value smaller than the target thickness. One of the reasons can be considered as following. Where the silica powder has a large electrostatic charging voltage, by the repulsive forces between the particles, an amount of the air introduced to the interstices of the silica powder deposited on the side wall of the mold is increased, and volume density is decreased. One reason can be considered as degassing of the air during the vitrification process. Further, where the volume resistivity is low, partial portion of the air escapes degassing and remains and causing fine air bubbles called micro-bubbles included in the glass. Such phenomena tends to occur when an amorphous silica powder is used.

The electrostatic charging voltage of the silica powder is influenced by a relative humidity of an ambient atmosphere in which the above-described silica powder exists. For example, the electrostatic charging voltage is influenced by a relative humidity of the silica powder supply atmosphere in the time of supplying the silica powder to the inner wall surface of the mold.

A relation between a relative humidity of a silica powder supply atmosphere and a charging voltage of the silica powder is shown in FIG. 1.

As shown in FIG. 1, where the relative humidity of the supply atmosphere is substantially less than 55%, electrostatic charging voltage of the silica powder as a large value substantially exceeding −1.5 kV. On the other hand, where the above-described relative humidity is 55% or more, electrostatic charging voltage of the silica powder has a small value of substantially −1.0 kV or smaller.

In this embodiment, for example, by controlling the relative humidity of the supply atmosphere to be 55% or more, electrostatic charging voltage of the silica powder is controlled to be −1.0 kV or smaller, and layer thickness of the silica powder deposit layer in the inner wall surface of the mold to be within ±1%.

By controlling the thickness of the silica powder deposit layer to be within ±1%, when a vitreous silica crucible is produced by heating, fusing, and vitrifying the layer, it is possible to obtain a vitreous silica crucible of constant wall thickness showing very small variation in the wall thickness. A more preferable relative humidity is 60% to 90%.

As a supplying device of a silica powder, for example, it is possible to use a device comprising a silica powder supplying pipe disposed in the vicinity of inner surface of the mold such that the silica powder flowing out from the supplying pipe is blown to the inner surface of the mold and deposited on the inner surface. Where the apparatus is constituted such that the deposited silica powder is shaved off by a device to achieve a target thickness, it is possible to provide a device of controlling a relative humidity of the supply atmosphere of the quartz crucible to be not less than 55% by blowing humidified air to an ambient space including the silica powder supplying pipe and inner surface of the mold in the vicinity of the pipe so as to increase the relative humidity in the space.

Figure 2:
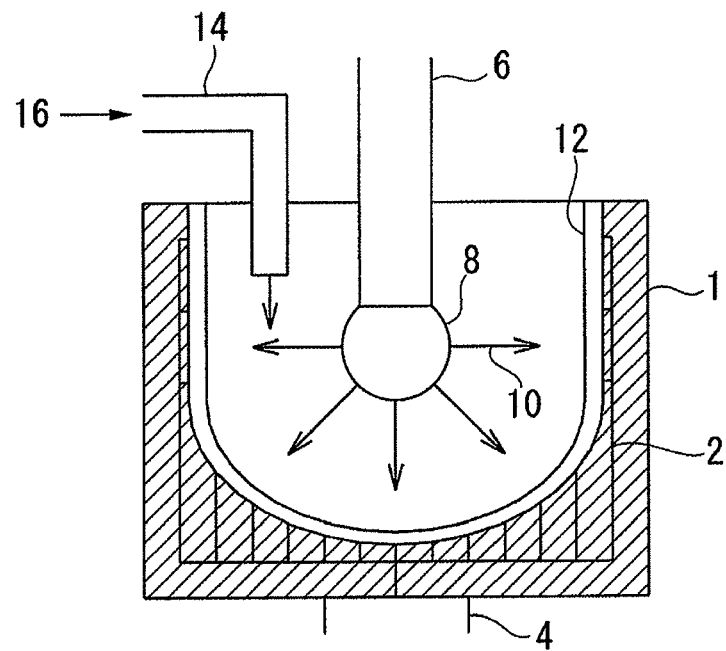
FIG. 2 is a vertical cross sectional view showing a state of depositing a silica powder while controlling a charging voltage of the silica powder in an embodiment of a method of producing a vitreous silica crucible according to the present invention.
Figure 3:
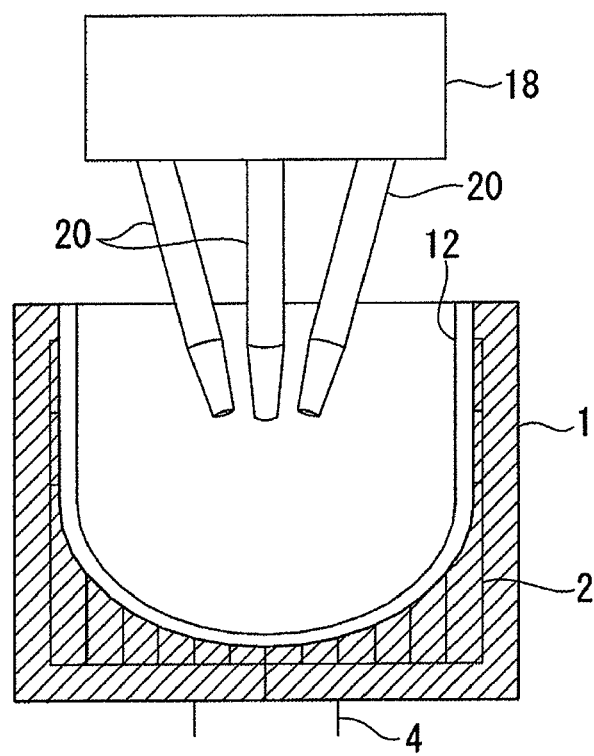
FIG. 3 is a vertical cross sectional view showing a state of ark-melting the silica powder in the same embodiment.

FIG. 2 and FIG. 3 show an embodiment of a method of producing a vitreous silica crucible according to the present invention. FIG. 2 shows a state of depositing the silica powder, and FIG. 3 denotes a state of fusing (melting) the deposited silica powder.

In FIG. 2, symbol 1 denotes a mold of cylindrical shape having a bottom. Although it is not limiting, for example, the mold may be formed of carbon. Numerous depressurizing passages 2 opened to the inner surface of the mold are formed in the interior of the mold. A depressurizing mechanism (not shown) is connected to the depressurizing passages. While rotating the mold 1 by a driving mechanism 4, it is possible to aspirate the air from the inner surface of the mold through the depressurizing passages.

When a silica powder is deposited on the mold, the silica powder supplying device 6 is disposed in the mold 1, and the silica powder 10 is sprayed from the lower end portion 8 of the supplying device 6 towards the inner surface of the mold 1. In the same time, using a humidity controlling device (humidifying mechanism) 14, humidified air 16, humidified atmospheric gas such as nitrogen, water vapor, or fine droplets of pure water is supplied towards the inside of the mold 1. By this device 14, relative humidity in the atmosphere of a region in which silica powder 10 flies is increased as described above, electric charging voltage of the silica powder 10 is reduced, and is controlled in the above-described range of the electric charging voltage. It is possible to provide a plurality of humidity controlling devices 14. Mold 1 is rotated by the driving mechanism 4 such that falling of the deposit layer 12 of the silica powder from the inner surface of the mold 1 is prevented by a centrifugal force.

While the humidity controlling device 14 is provided independent of the silica powder supplying device 6 in FIG. 2, the two devices may have an integrated configuration. For example, humidified air, humidified atmospheric gas such as nitrogen, water vapor, or fine droplets of pure water may be sprayed together with the silica powder through the silica powder supplying device 6. A spray (scattering) method of the silica powder by the supplying device is not limited in the present invention. It is possible to spray the silica powder in any method.

As described above, by controlling the relative humidity in the atmospheric gas in the mold 1 by the humidity controlling device 14 and thereby controlling the electric charging voltage of the silica powder, it is possible to suppress inhomogeneity in thickness of the deposit layer 12 caused by repulsive force between particles of the silica powder as a result of electric charging of the silica powder.

While the electric charging voltage of the silica powder 10 is controlled by controlling relative humidity, it is possible to apply another charge-controlling device, provided that the electric charging voltage can be controlled. For example, it is possible to use various static eliminator. Specifically it is acceptable to form ions in the air or in the other gas, and charged electron of the silica powder 10 may be neutralized by this ion. Generation of ions may be performed by known method, for example, by corona discharge, or by utilizing an electromagnetic wave.

Next, while rotating the mold 1 deposited with the deposit layer 12, the deposit layer 12 is heated and fused by arc discharge device 18. The deposit layer is held on the inner wall surface of the mold by a centrifugal force generated by the rotation of the mold.

The arc discharge device 19 has a plurality of bar shaped carbon electrodes 20 made of highly pure carbon, and an electrode-moving device (not shown) that holds and moves the carbon electrodes 20, and a power source device (not shown) that energizes electric current in each of the carbon electrodes 20. Although three carbon electrodes are used in the present embodiment, it is acceptable to use two or four or more electrodes provided that arc discharge can be generated between the carbon electrodes 20. Shapes of the electrodes are not limited. In the present embodiment, the carbon electrodes 20 are arranged such that the electrodes approach each other at the tips of the electrodes. The power source may be an AC power source or a DC power source. In the present embodiment, each phase of three-phase alternating current is connected to each of the carbon electrodes 20.

By depressing the deposit layer 12 through the depressing passage 2 while heating the deposit layer 12 by arc discharge device 18, the silica deposit layer 12 is molten and the silica glass layer (vitreous silica layer) is formed. After cooling, the vitreous silica crucible is removed from the mold 1, and is subjected to shaping. Thus a vitreous silica crucible is formed.

EXAMPLE

In the following, Examples and Comparative Example of the present invention are shown.

A purified silica (quartz) powder of high purity and of 250 μm in average grain size was used. The silica powder was supplied by a supplying device to an inner surface of rotating carbon mold (720 mmφ in inner diameter, 70 rpm in rotation frequency) and was deposited on the inner surface. At that time, by supplying a humidified air into the mold, relative humidity of the atmospheric gas of the atmosphere in which the silica powder path through was controlled in various values. Thus, electrostatic charging voltage of the silica powder was controlled in the range of −2.9 kV to −0.9 kV. When the relative humidity was about 55%, electrostatic charging voltage was −1.0 kV.

Next, silica powder at the wall portion was shaved (scraped) using a jig (device) to control the layer thickness in the target thickness (25 mm). In each case, layer thickness of a bottom silica power layer compared with the target thickness (25 mm) of a bottom portion of the crucible was shown in Table 1. A layer thickness of the silica powder layer deposited on the bottom portion of the crucible was measured by the distance between the jig fixed in the center of the mold and a surface of the silica powder layer by a caliper.

Each specimen was subjected to the arc-heat fusing (heating temperature 2000° C.) as shown in FIG. 3, and a vitreous silica crucible was produced by vitrifying the silica powder. Then, wall thickness of the crucible was measured. Proportion (in % of the target wall thickness) of the wall thickness of each actual product to a target wall thickness of a vitreous silica crucible was shown in Table 1. The wall thickness of the vitreous silica crucible was measured using a caliper and an ultrasonic measuring device.

As shown in Table 1, in the specimens of the present invention in which electrostatic charging voltage was controlled to be not more than −1.0 kV, proportion of wall thickness of the actually deposited silica powder layer was 99.2% to 100.6%, and layer thickness of the actually deposited silica powder deposit layer was controlled within ±1% compared with the target thickness. As a result, wall thickness of the thus produce vitreous silica crucible was 100.5% to 99.3% of the target thickness, and fluctuation of wall thickness was very small.

On the other hand, comparative specimens in which electrostatic charging voltage of the silica powder was −2.9 kV to −1.4 kV, proportion of wall thickness of the actually deposited silica powder layer was 105.6% to 103.9% in the bottom portion, and layer thickness of the actually deposited silica powder deposit layer could not be controlled within ±1% compared with the target thickness. As a result, thickness of a side wall of the produced vitreous silica crucible was 98.0% to 98.3% of the target thickness, whereas the bottom wall thickness was thickened to 101.9% to 102.5%, and fluctuation of wall thickness in the wall crucible was larger than in the case of the specimens of the present invention.

TABLE 1

| No. | Electrostatic charging voltage of silica powder (kV) | Proportion to target thickness of silica powder deposit layer in bottom portion | Proportion to target thickness of vitreous silica crucible |
|---|---|---|---|
| 1 | −0.9 | 99.2% | 99.5 to 100.5% |
| 2 | −1.0 | 100.6% | 99.3 to 100.4% |
| 3 | −1.4 | 103.9% | 98.3 to 101.9% |
| 4 | −2.9 | 105.6% | 98.0 to 102.5% |

INDUSTRIAL APPLICABILITY

According to a method of producing a vitreous silica crucible of the present invention, electrostatic charging voltage of silica powder is controlled in a range of not more than 1.0 kV in absolute value, and the silica powder is supplied to the inner wall surface of the mold. As a result, it is possible to control a density of a silica powder layer deposited on an inner surface of the mold to be within a predetermined range, thereby providing vitreous silica crucible of constant thickness that shows very small fluctuation in wall thickness after the vitrification. Therefore, the present invention has industrial applicabilities.

The invention claimed is:

1. A method of producing a vitreous silica crucible, comprising:
   performing deposition of a silica powder by depositing silica powder as a single layer of unmelted silica powder on an inner wall surface of a cylindrical mold that has a bottom while rotating the mold;
   shaving the wall using a device to control the thickness of the single layer of unmelted silica powder in the target thickness; and
   performing fusion of the single layer of unmelted silica powder to obtain a vitreous silica crucible comprising a single layer of vitreous silica by heating, fusing through a one-step arc heat fusing process after the step of shaving, and thereby vitrifying the silica powder deposited on the inner surface of the mold,
   wherein:
   during the deposition of the silica powder, electrostatic charging voltage of the unmelted silica powder is controlled to be in a range of 0.0 kV to −1.0 kV in absolute value by controlling a relative humidity of an atmospheric gas being in contact with the unmelted silica powder to be not lower than 55%, by adding humidified gas, water vapor, or droplets of pure water to the atmospheric gas being in contact with the unmelted silica powder without performing an arc heat fusing process at the same time,
   the thus controlled unmelted silica powder is supplied to the inner wall surface of the mold to maintain the density of the deposited unmelted silica powder layer on the inner wall surface of the mold within a predetermined range, wherein the thickness of the unmelted silica powder layer deposited on the bottom portion of the mold is controlled to be within ±1% compared with the target thickness, and
   the one-step arc heat fusing process performed after the step of shaving is the only arc heat fusing process performed.

2. A method of producing a vitreous silica crucible according to claim 1, wherein the relative humidity is controlled to be in a range of 60% to 90%.

3. A method of producing a vitreous silica crucible according to claim 1, wherein the electrostatic charging voltage is controlled to be in a range of 0.0 kV to −0.9 kV in absolute value.

* * * * *